US006661005B1

(12) United States Patent
Bruenger

(10) Patent No.: US 6,661,005 B1
(45) Date of Patent: Dec. 9, 2003

(54) METHOD OF EXAMINING AND/OR MODIFYING SURFACE STRUCTURES OF A SAMPLE

(75) Inventor: Wilhelm Bruenger, Itzehoe (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/830,998
(22) PCT Filed: Oct. 25, 1999
(86) PCT No.: PCT/EP99/08057
 § 371 (c)(1),
 (2), (4) Date: May 1, 2001
(87) PCT Pub. No.: WO00/28571
 PCT Pub. Date: May 18, 2000

(30) Foreign Application Priority Data

Nov. 9, 1998 (DE) .......................... 198 51 622

(51) Int. Cl.⁷ ................................................ H01J 37/00
(52) U.S. Cl. ........................................ 250/306; 250/307
(58) Field of Search ............................ 250/309, 492.21, 250/306, 307

(56) References Cited

U.S. PATENT DOCUMENTS 4,341,957 A  *  7/1982  Wieder .................... 250/461.2
4,918,309 A  *  4/1990  Beha et al. ................. 250/306
4,983,830 A      1/1991  Iwasaki
5,591,970 A      1/1997  Komano

FOREIGN PATENT DOCUMENTS

DE   33 32 248 A1    3/1985
EP   0 969 494 A1    1/2000
WO   WO 98/32153 A2  7/1998

OTHER PUBLICATIONS

Hiroshi Yanagisa, "Apparatus for Surface Analysis", Patent Abstracts of Japan, p. 353, May 2, 1985.

Dieter Winkler et al., "E-beam probe station with integrated tool for electron beam induced etching", Microelectronic Engineering 31 (1996) pp 141-147.

W.H. Brunger et al., "E-Beam Induced Fabrication of Micro-Structures", Micro Electro Mechanical Systems '92, Travemunde (Germany), Feb. 4-7, 1992.

* cited by examiner

Primary Examiner—John R. Lee
Assistant Examiner—Paul M. Gurzo
(74) Attorney, Agent, or Firm—Dougherty, Clements & Hofer

(57) ABSTRACT

In a method of examining the surface structures of a sample or of modifying the surface structures of a sample by means of a beam impinging on the surface structure of the sample, gas is supplied discontinuously, preferably in a pulsed mode, at least in the area of impingement of the beam on the surface structure of the sample.

14 Claims, 3 Drawing Sheets

METHOD OF EXAMINING AND/OR MODIFYING SURFACE STRUCTURES OF A SAMPLE

DESCRIPTION

The present invention relates to a method of examining and/or modifying surface structures of a sample by means of a beam impinging on the surface structure of the sample, in the case of which gas is supplied at least in the area of impingement of the beam on the surface structure of the sample.

From the technical publication W. H. Brunger and K. T. Kohlmann, "E-Beam Induced Fabrication of Microstructures", Micro Electro Mechanical Systems '92, published in connection with the conference of the same name held in Travemünde on Feb. 4 to 7, 1992, it is already known to produce microstructures on the basis of an electron beam-induced manufacturing method. For such a method, a modified scanning electron microscope is typically used for electron beam-induced deposition. The sample to be processed is arranged in a chamber in the area of impingement of the electron beam, the sample being surrounded by a metallo-organic precursor gas which is kept in the interior of a subchamber at a pressure of e.g. $2 \times 10^{-2}$ mbar. The electron beam enters the subchamber through an opening the subchamber maintaining the basic pressure within the microscope at $10^{-5}$ mbar.

In order to obtain an increased deposition rate in the deposition process, this publication additionally suggests that a subchamber arrangement should be dispensed with and that the precursor gas should continuously be supplied to the point of impingement of the electron beam on the sample. In typical embodiments the continuous gas supply takes place via a gas nozzle having a small opening of e.g. 100 micrometers which is positioned very close to the point of impingement of the electron beam. Typical distances lie between 100 micrometers and 1 millimeter. This application of the precursor gas to a particular surface area of the sample, instead of flooding a subchamber or object chamber, has the advantage that the scattering of the beam is reduced, whereby the resolution is improved. However, even if the gas is continuously supplied to a particular surface area by means of a gas nozzle, the electrons or other image-forming particles of the beam will encounter gas particles on part of their way and will be scattered.

A further problem of the described deposition process by means of local application of gas to a surface area of the sample is that the deposition rate is limited by the gas flow, which, in turn, has an upper limit due to the maximum admissible chamber pressure of the system and the suction power of the pump system.

The publication D. Winkler, et al., "E-beam Probe station . . . ", Microelectronic Engineering 31 (1996), pp. 141–147, already discloses a method of electron-induced etching of passivated integrated circuits. In the case of this method, gas is supplied via a nozzle to the area of impingement of an electron beam on the surface structure to be etched. Etching gas molecules are here adsorbed on the surface, and a dissociation of the gas molecules takes place subsequently due to the interaction with the ion beam. Following this, product molecules with a substrate are formed, whereupon the etching product is desorbed and removed from the surface. Also during product formation, during desorption and during the removal of the etching product an interaction with the electron beam takes place. However, the electron beam is, also in this case, scattered at the gas particles which are locally supplied via a nozzle to the surface structure of the sample to be etched.

Starting from this prior art, it is the object of the present invention to further develop a method of examining or modifying surface structures of a sample by means of a beam, in such a way that an improved resolution and/or an improved surface modification accuracy is achieved.

This object is achieved by a method according to claim 1.

The present invention is based on the finding that, in the case of the above-mentioned examination method or in the case of the method for modifying surface structures by means of a beam, an improved local resolution will be achieved when a discontinuous, preferably pulsed gas supply is used instead of the continuous gas supply.

According to one embodiment of the present invention, a gas blast of higher pressure is first applied to the surface of the sample. The gas particles are adsorbed on the surface where they remain for a certain period of time, which depends on the type of gas used and on the surface temperature of the sample, among other parameters. The particle beam will preferably be caused to impinge on the surface structure of the sample when, after the termination of the pulsed gas supply, the volume gas blasts are already rare, whereas the surface gas blasts still occur frequently, since the particles of the beam will then reach the surface unscattered where they will able to bring about chemical or other reactions.

The method is, however, also used for examining the surface of a sample by means of an electron beam; in this case, the discontinuously supplied gas serves to reduce or to prevent an electric charge on the surface of the sample.

In the following, a preferred embodiment of the present invention will be explained in detail making reference to the drawings enclosed, in which.

Figure 1:
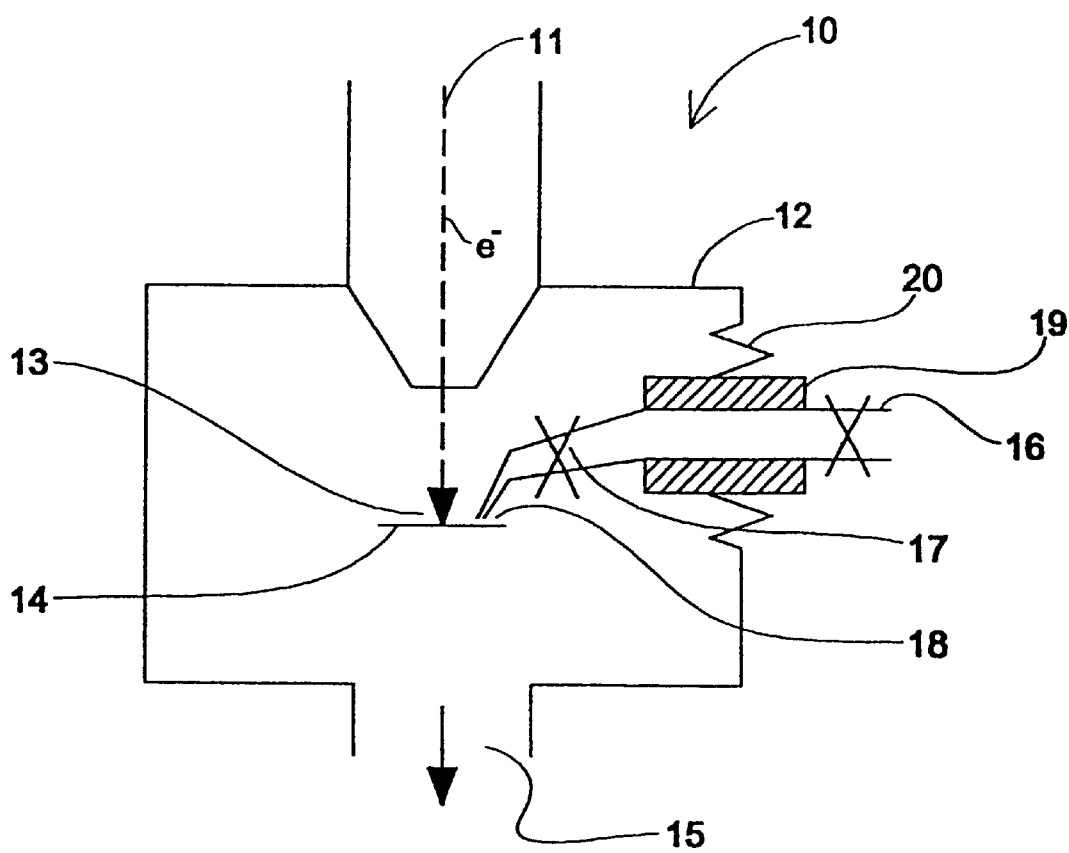
FIG. 1 shows a scanning electron microscope used for examining a sample.

As shown in FIG. 1 as a schematic cross-sectional representation, a modified scanning electron microscope, designated generally by reference numeral 10, comprises an electron beam gun (not shown) that generates an electron beam 11 which passes through a chamber 12 at a basic pressure of $10^{-5}$ mbar so as to impinge on the surface of a sample 14 in an area of impingement 13. The above-mentioned low internal pressure of the chamber 12 is established by a pump system (not shown) which evacuates the chamber 12 through a suction opening 15.

The chamber 12 is supplied with process gas via a supply line 16 provided with a microvalve 17 directly in front of its discharge nozzle 18 so as to avoid dead spaces worth mentioning. The position of the discharge nozzle 18 relative to the area of impingement 13 of the sample 14 can be adjusted by a manipulator (not shown). The supply line 16 is connected via a seal 19 to a flexible area 20 of the chamber 12 for this reason.

As has already been explained, the gas is supplied discontinuously by controlling the microvalve 17. According to a preferred embodiment, the discontinuous supply of gas is effected as a pulsed supply or as a purposefully temporally controlled supply. In this case, the microvalve is controlled such that the switching time and the pulse duration, respectively, are in the range of from approx. 100 μs to a few seconds, e.g. 1 ms.

The scanning of the sample surface to be examined by the electron beam 11 takes place after a period of time after the termination of the gas blast after which the gas particles adsorbed on the surface are still effective.

Depending on the process gas used as well as on the beam used, which may be an ion beam, electron beam, X-ray beam or a laser beam, the arrangement shown is, in principle, also suitable for particle beam-induced deposition of materials on the surface of the sample or for particle beam-induced etching.

Figure 2:
FIG. 2 shows a scanning electron micrograph of a ceramic surface with charge phenomena.

FIG. 2 shows a scanning electron micrograph of a ceramic surface during scanning of said surface by a scanning electron beam, without any gas being introduced through the supply line 16, so that charge phenomena will occur on the ceramic surface.

Figure 3:
FIG. 3 shows a micrograph corresponding to that of FIG. 2 with charge neutralization by gas supply.

FIG. 3 shows the scanning electron micrograph of the same ceramic surface, but with charge neutralization accomplished by the supply of a gas neutralizing the surface charge.

Figure 4:
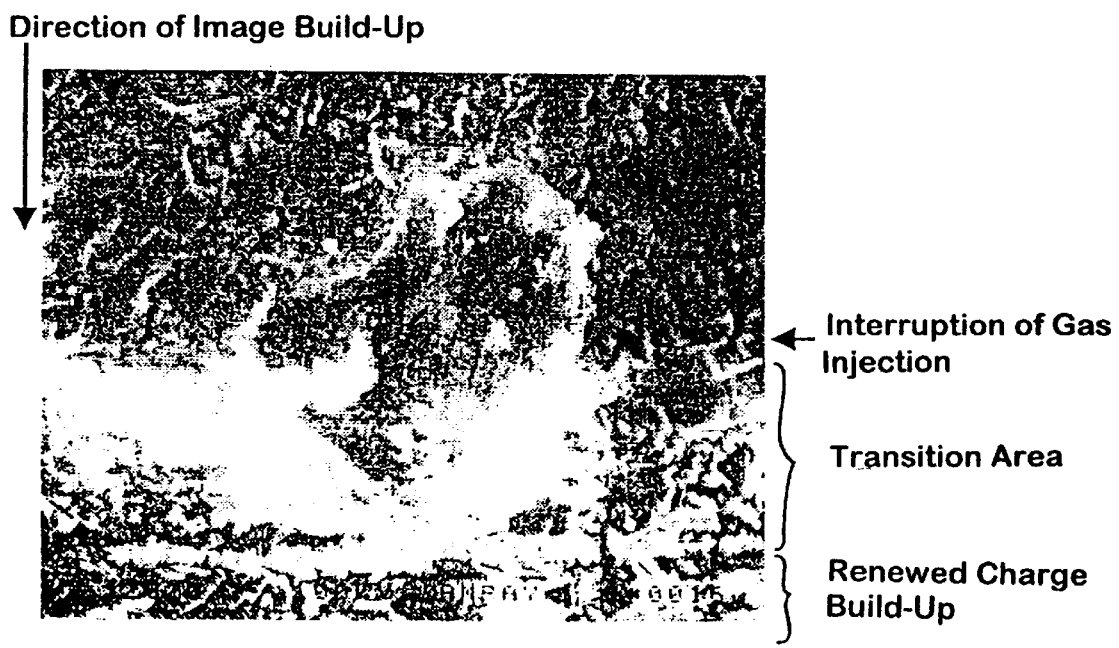
FIG. 4 shows a scanning electron micrograph with interruption of the gas supply during image scanning by the scanning electron microscope.

FIG. 4 shows a scanning electron micrograph in the case of which the supply of gas is interrupted, during image scanning, approximately on the level of the middle of the image so that an undisturbed transition area will be obtained in a region approximately from half the image up to approx. 80% of the image in the direction of image build-up, the transition area being followed in the rearmost (lowermost) fifth of the image, when seen in the direction of image build-up, by an area which is disturbed again by renewed charge build-up.

What is claimed is:

1. A method of examining and/or modifying surface structures of a sample by means of a beam impinging on the surface structure of the sample, in the case of which gas is supplied at least in the area of impingement of the beam on the surface structure of the sample, wherein the a gas is supplied discontinuously.

2. A method according to claim 1, wherein the gas is supplied in a pulsed mode.

3. A method according to claim 2, wherein the pulse duration is shorter than a few seconds.

4. A method according to claim 2, wherein the beam is directed onto the surface structure of the sample only during periods of time in which the gas particles adsorbed on the surface are still effective after the termination of the pulsed supply of gas.

5. A method according to claim 1, wherein the surface of the sample is examined by means of an electron beam of an electron microscope, wherein the gas reduces the degree to which the surface of the sample is electrically charged.

6. A method according to claim 5, wherein for the examination of biological objects the gas is chosen in such a way that, when imaged, the biological objects remain viable or that their structures are only affected to a minor extent.

7. A method according to claim 6, wherein the gas is $H_2O$.

8. A method according to claim 1, wherein the surface of the sample is chemically modified by the effect of charged particles of the beam on gases adsorbed on the surface of the sample.

9. A method according to claim 8, wherein the gas is a process gas which is suitable for beam-induced etching of the surface of the sample.

10. A method according to claim 8, wherein the gas is a process gas which is suitable for beam-induced deposition of materials on the surface of the sample.

11. A method according to claim 1 wherein the beam is an electron beam.

12. A method according to claim 1, wherein the beam is an ion beam.

13. A method according to claim 1, wherein the beam is a laser beam.

14. A method according claim 1, wherein the beam is an X-ray beam.

* * * * *